United States Patent
Hageraats

(10) Patent No.: US 7,856,221 B1
(45) Date of Patent: Dec. 21, 2010

(54) MIXER TOPOLOGIES HAVING IMPROVED SECOND ORDER INTERMODULATION SUPPRESSION

(75) Inventor: Johannes J. Hageraats, Kamuela, HI (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 1398 days.

(21) Appl. No.: 11/315,074

(22) Filed: Dec. 22, 2005

(51) Int. Cl.
   *H04B 1/26* (2006.01)
(52) U.S. Cl. .................. 455/323; 455/326; 455/318; 327/116; 327/133
(58) Field of Classification Search .................. 455/326, 455/330, 333, 296, 424, 425, 456.5, 456.6, 455/561, 550.1, 575.1, 501, 63.1, 67.13, 455/190.1, 258, 283, 278.1, 295, 318, 317, 455/319, 323, 332, 325; 327/113, 116, 133, 327/355–359; 330/254, 255, 262, 268
   See application file for complete search history.

(56) References Cited

U.S. PATENT DOCUMENTS

| | | | | |
|---|---|---|---|---|
| 5,060,298 | A * | 10/1991 | Waugh et al. | 455/326 |
| 5,438,693 | A * | 8/1995 | Cox | 455/333 |
| 5,960,334 | A * | 9/1999 | Nakano | 455/188.1 |
| 6,163,222 | A * | 12/2000 | Kobayashi | 330/302 |
| 6,351,632 | B1 * | 2/2002 | Yan et al. | 455/333 |
| 6,404,263 | B1 * | 6/2002 | Wang | 327/359 |
| 6,654,595 | B1 * | 11/2003 | Dexter | 455/323 |
| 7,092,692 | B2 * | 8/2006 | Tan et al. | 455/333 |
| 7,099,646 | B1 * | 8/2006 | Jin et al. | 455/313 |
| 7,109,795 | B2 * | 9/2006 | van Zeijl | 330/254 |
| 7,146,149 | B1 * | 12/2006 | Krishnamurthi | 455/318 |
| 7,236,761 | B2 * | 6/2007 | Kivekas et al. | 455/313 |
| 7,299,028 | B2 * | 11/2007 | Kim | 455/318 |
| 7,356,317 | B2 * | 4/2008 | Xu et al. | 455/130 |
| 7,489,916 | B1 * | 2/2009 | Farias et al. | 455/315 |
| 2002/0193089 | A1 * | 12/2002 | Hatcher et al. | 455/326 |
| 2004/0061544 | A1 * | 4/2004 | Watanabe et al. | 327/359 |
| 2005/0107055 | A1 * | 5/2005 | Bult et al. | 455/234.1 |
| 2006/0217101 | A1 * | 9/2006 | Connell et al. | 455/323 |
| 2006/0234664 | A1 * | 10/2006 | Chiu et al. | 455/285 |
| 2008/0139164 | A1 * | 6/2008 | Barre | 455/326 |

* cited by examiner

*Primary Examiner*—Duc Nguyen
*Assistant Examiner*—Charles Chow
(74) *Attorney, Agent, or Firm*—Blakely Sokoloff Taylor & Zafman LLP

(57) ABSTRACT

Mixer topologies that have sufficiently high IIP2 and sufficiently low quadrature error to make zero IF receivers possible without special calibration techniques. This simplifies the receiver, avoids circuit startup delay and provides more stable performance over time and temperature. The methodology to achieve this performance in preferred embodiments consists of as many as three elements: (a) a high power local oscillator buffer circuit capable of driving low impedance loads coupled to the bases of the bipolar mixer transistors, (b) an optimized bias block for the mixer core and (c) incorporating two or more electronically programmable quad sections and selecting the best quad for use. Other types of transistors may also be used.

36 Claims, 3 Drawing Sheets

MIXER TOPOLOGIES HAVING IMPROVED SECOND ORDER INTERMODULATION SUPPRESSION

BACKGROUND OF THE INVENTION

1. Field of the Invention

The present invention relates to the field of direct conversion receivers for wireless communication.

2. Prior Art

High IIP2 (second order input intercept point) and low quadrature error are important requirements for direct conversion receivers to avoid distortion of the desired signal at low frequencies when converting directly from RF to baseband frequencies. In that regard, note that the IM2 (second order intermodulation) products also appear at zero IF. The IIP2 and quadrature error of current art mixers is generally not sufficient to make zero IF receivers possible without special calibration techniques. These techniques are undesirable because: (a) they may create a DC component which could block/overload the baseband, (b) they complicate and/or delay the start-up of the chip and end product (e.g. cellular phone), (c) they only work with a dedicated baseband chip, and (d) the performance over time and temperature may not be stable.

DETAILED DESCRIPTION OF THE PREFERRED EMBODIMENTS

The present invention provides mixers with IIP2 and quadrature errors that are sufficiently low to make zero IF receivers possible without special calibration techniques. This simplifies the receiver, avoids circuit startup delay and provides more stable performance over time and temperature. The methodology to achieve this performance in preferred embodiments consists of as many as three elements: (a) a high power LO (local oscillator) buffer circuit capable of driving low impedance loads, (b) an optimized bias block for the mixer core and (c) two or more electronically programmable mixer quad sections.

Figure 1A:
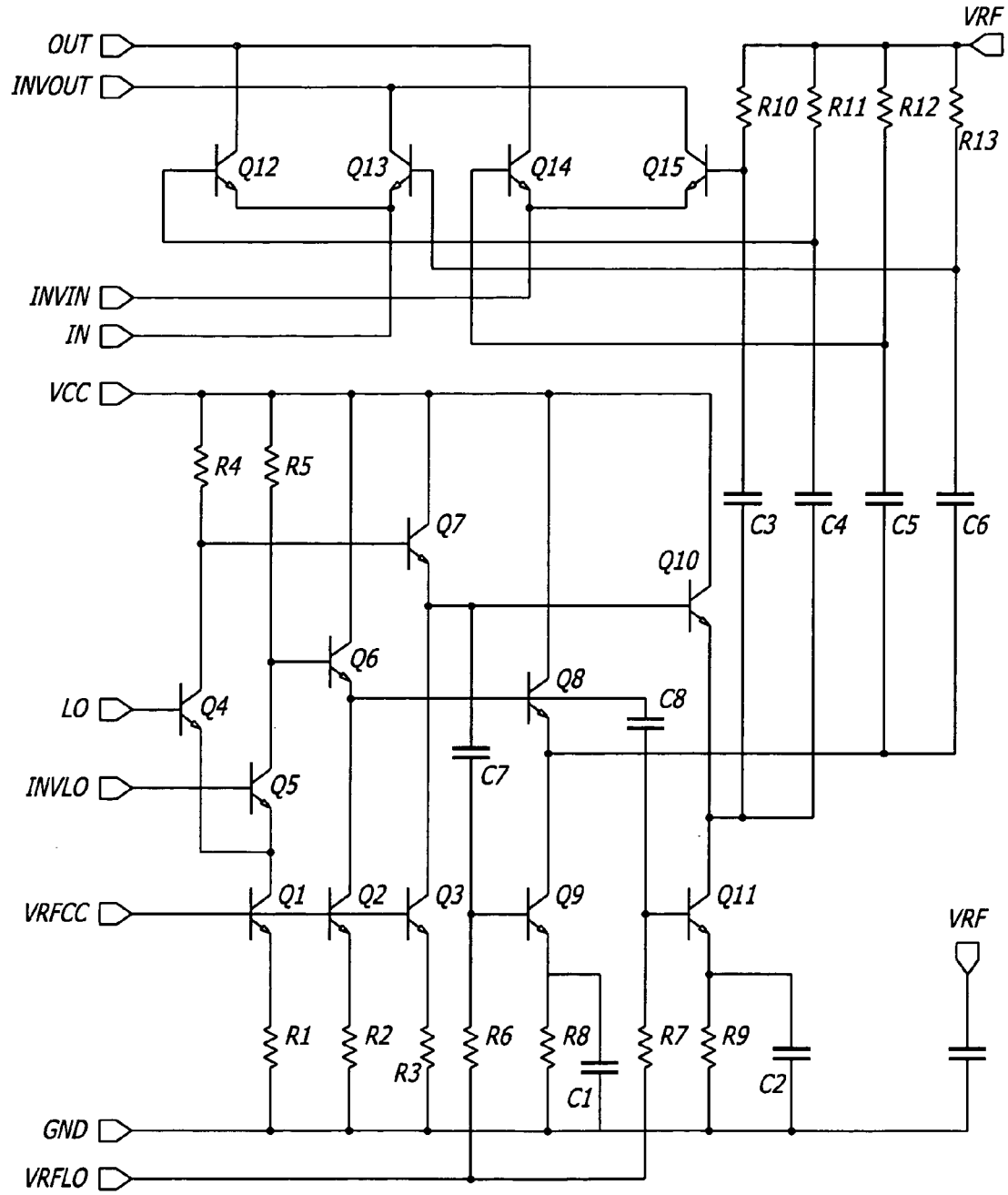
FIG. 1a is a circuit diagram of a preferred embodiment of the present invention local oscillator amplifier and mixer core.

The LO buffer and mixer core of the preferred embodiment is shown in FIG. 1a. The buffer typically consists of three stages. Transistors Q1 through Q3, having their bases connected to a reference voltage VRFCC, together with emitter resistors R1 through R3, provide bias currents to the first and second stages. The first stage is a differential pair Q4 and Q5 with load resistors R4 and R5, amplifying the differential local oscillator input signal LO and INVLO and limiting it to 300 mVp as an example. The second stage is a common collector circuit comprising transistors Q6 and Q7, needed to avoid any distortion of the waveform because of the high loading of the last stage, a push-pull amplifier. The push-pull amplifier comprises transistors Q8 and Q9, and Q10 and Q11, providing a complementary output. The bases of pull-down transistors Q9 and Q11 are pulled down by resistors R6 and R7. Resistors R8 and R9 are emitter resistors for pull-down transistors Q9 and Q11, with capacitors C1, C2, C7 and C8 accelerating the turn on and turn off of the pull-down transistors Q9 and Q11. This stage is critical to achieve a high slew rate into a low impedance load. The exceptionally high slew rate minimizes the effect of any transistor beta mismatch in the mixer core and dramatically reduces the IM2 and the quadrature error. Preferably the slew rate in volts per second is at least 4 volts times the frequency of operation in cycles per second.

Figure 1B:
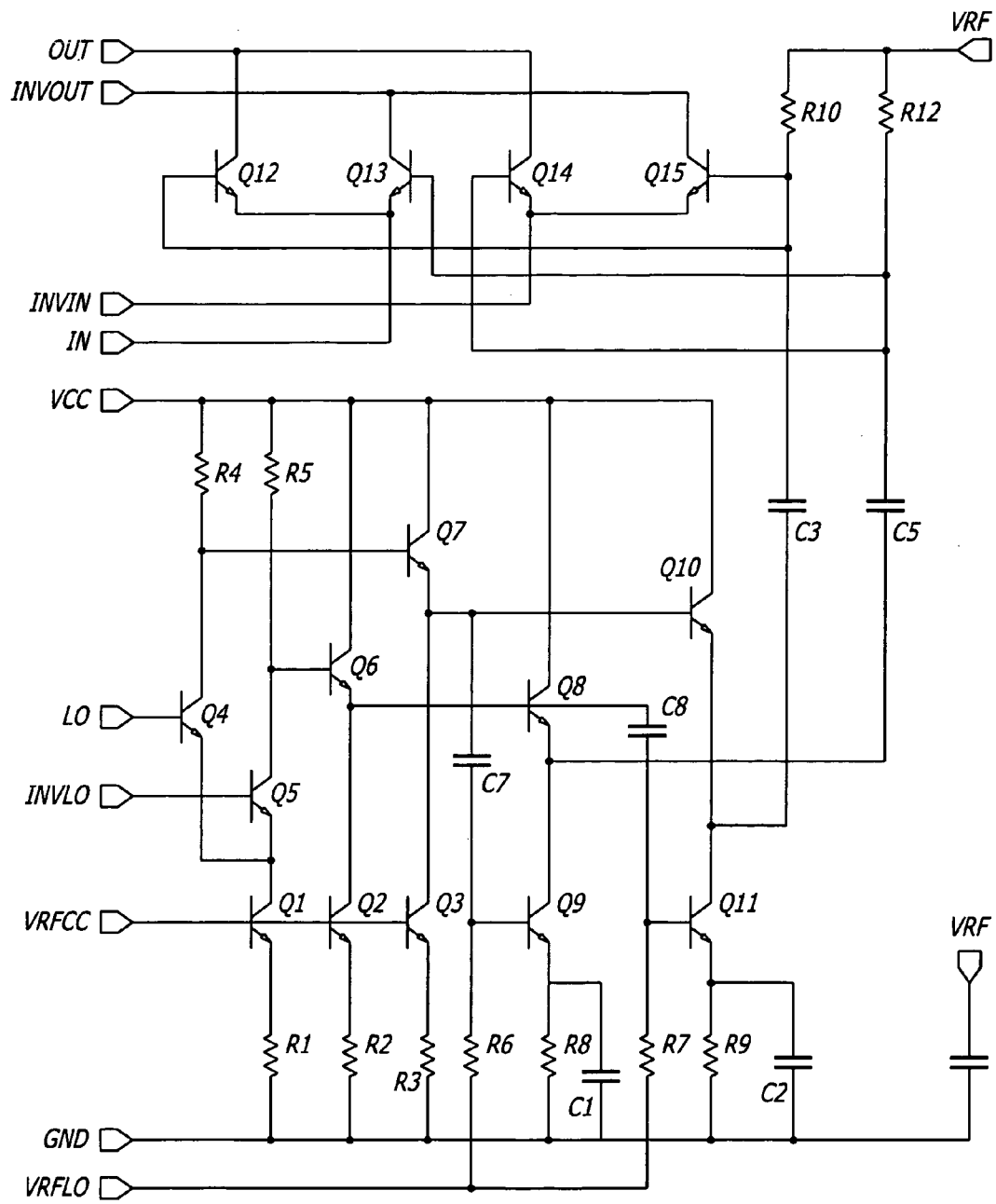
FIG. 1b is a circuit diagram of an alternate embodiment of the present invention local oscillator amplifier and mixer core.

One alternate embodiment of LO buffer and mixer core of the present invention is shown in FIG. 1b. This embodiment is similar to that of FIG. 1a with the exception that rather than each of the differential outputs of the LO buffer driving two capacitors, with each capacitor being coupled to a respective load resistor and a base in the mixer quad, each of the differential outputs of the LO buffer drive one capacitor C3 and C5, with each of these capacitors being coupled to a respective load resistor and the bases of a respective pair of transistors in the mixer quad. This embodiment is not preferred however, as it is preferred not to connect the base voltages of pairs of mixer quad transistors together.

The bias block for the mixer core of the embodiment of FIG. 1a consists of four resistors R10 through R13. One terminal of each resistor is connected to a common mode voltage VRF, and the other terminal is connected to one of the four base leads in the doubly balanced mixer quad of transistors Q12 through Q15 operating between inputs IN and INVIN and outputs OUT and INVOUT. By keeping the resistor impedance of resistors R10 through R13 low, the impact of beta mismatch in the transistors in the mixer quad is minimized. In that regard, in current state-of-the-art process technologies, one of the most important factors that degrade the IIP2 mixer performance is NPN transistor beta mismatch in the mixer quad. The mismatch results in non-equal base currents that flow through the bias resistors tied to the bases of the transistors of the mixer quad, and consequently create Vbe offsets. These asymmetries neutralize the potential cancellation of even order products in doubly balanced mixers. Typically in the prior art, the resistor values tied to the bases of the switching quad (mixer transistors) are larger than the base input impedance of the mixer transistors, such as 4 time larger, to ensure that most of the signal current flows into the quad and only a relatively small amount of signal current is wasted. By way of example, for one implementation of the present invention, the base input impedance is approximately 500 Ohm for two differential pairs in parallel (as in a quad) or 1 Kohm each at a frequency of 2 GHz. Thus, in the prior art, a resistor value of 2K each if four resistors were used (or two resistors of 1K each to the reference voltage if only two resistors are used) would be a good choice for the resistors. In a preferred embodiment of the present invention, however, the bias resistors have been lowered to one tenth of this impedance (200 Ohm each if four resistors are used as in the embodiment of FIG. 1a, or two resistors of 100 Ohm each if two resistors are used as in the embodiment of FIG. 1b) to reduce the impact of NPN beta mismatch. Similarly, in order to drive this load, the output impedance of the LO buffer is four times smaller yet, or 50 Ohm to drive the load efficiently.

The foregoing values are representative of one embodiment. However, generally it is preferred that at the frequency of interest, the resistor impedances be less than the base input impedance(s) connected to each resistor, and more preferably less than one half and still more preferably less than one fourth the base input impedance(s) connected to each resistor. It is also generally preferred that at the frequency of interest, the LO buffer output impedance be less than the impedance of the combination of resistors, taken alone (neglecting the base input impedance(s) connected thereto), and more preferably less than one half the impedance of the combination of resistors, taken alone, and still more preferably less than one fourth the impedance of the combination of resistors, taken alone.

Furthermore, by using four series capacitors C3 through C6, a given set of two base leads (base leads of transistors Q12 and Q15 or transistors Q13 and Q14) is AC coupled to the LO signal but are not connected DC wise. This also desensitizes the design to the impact of Vbe and beta mismatch in the mixer core.

The final technique employed in the preferred embodiment to minimize the impact of Vbe and/or beta mismatches in the mixer core is to increase the number of mixer quads (typically only one in current art mixers). During wafer sort, the quad with best IM2 is determined, after which it is programmed permanently by blowing a fuse and/or trim link. This improves the standard deviation of the IM2 by approximately 2× (for one additional quad). By integrating the push-pull power amplifier with each quad, no additional LO power is needed to achieve the same performance. Obviously more than two mixer cores could be used, further improving the standard deviation of the IM2.

Figure 2:
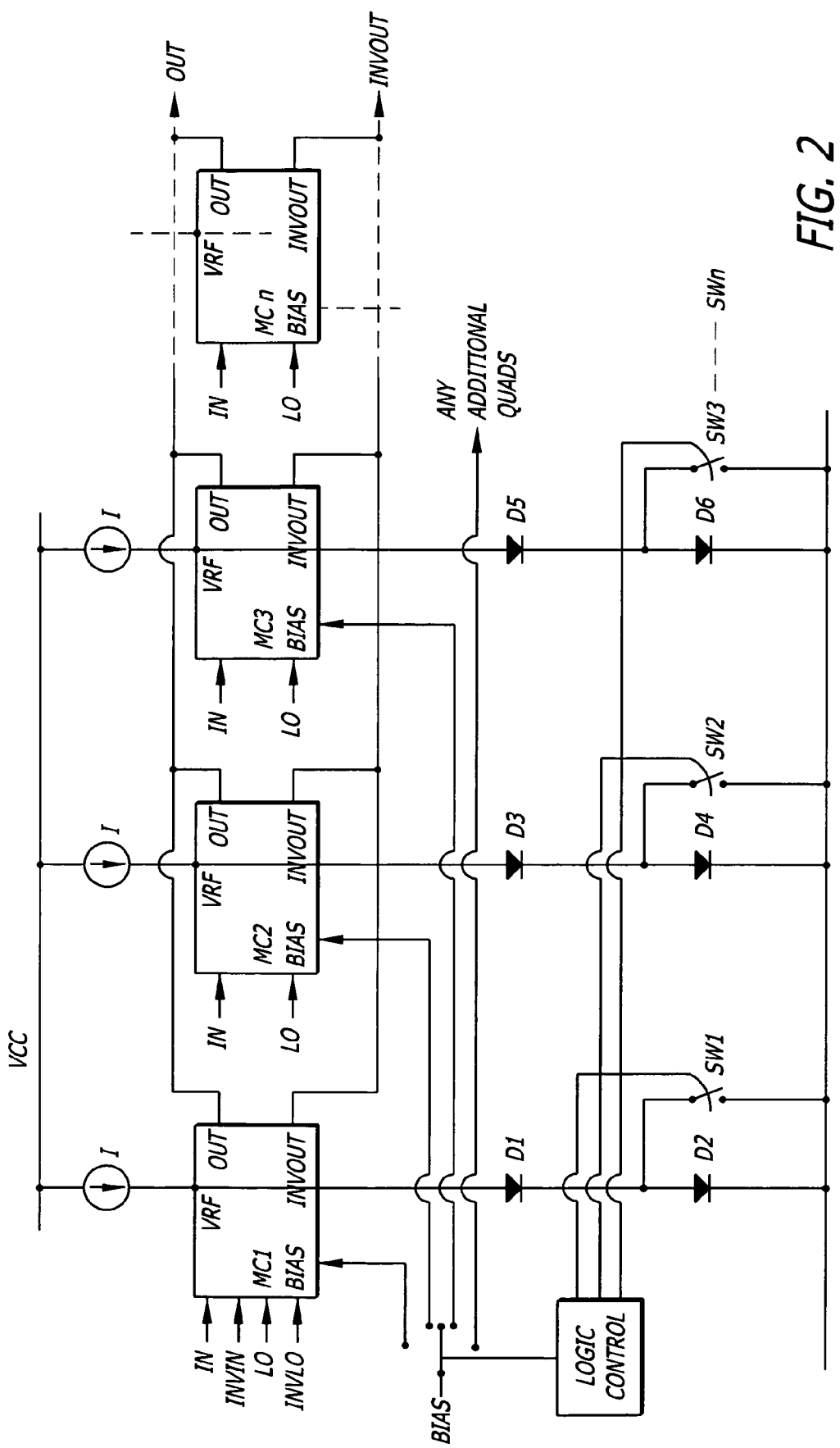
FIG. 2 is a diagram illustrating a circuit for incorporating multiple LO buffers and mixer cores.

A diagram illustrating a circuit for incorporating multiple LO buffers and mixer cores is shown in FIG. 2. For each LO buffer and mixer core, there is a current source I and two diodes D1 and D2, D3 and D4, D5 and D6, etc. connected in series between VCC and GND, with the voltage VRF above the two diodes coupled to the respective LO buffer and mixer core, as shown in both FIGS. 1a and 1b. Switches SW1 through SWn are controlled by control logic that determines which switch is open, only one of these switches being open at any one time. For the open switch, the voltage VRF to the respective mixer core will be two diode voltage drops above ground, with the voltage VRF to the other mixer cores being one diode voltage drop above ground. The mixer core with the highest VRF will be the active core, with the other mixer cores merely presenting open collector connections to the mixer outputs OUT and INVOUT.

The control logic also controls a one of n switch SWB that couples bias voltages to the LO amplifiers, specifically the bias voltages VRFCC and VRFLO shown in FIG. 1a. This determines which LO amplifier is active. Operation of this switch is coordinated with the operation of switches SW1 through SWn to activate only one mixer core with its associated LO amplifier at any one time. Thus during wafer sort, the switches may be individually turned on and each LO amplifier and mixer core tested, one at a time, to determine which quad has the best IM2, after which the best mixer quad is permanently selected by blowing a fuse and/or trim link.

The present invention improves the second order intermodulation and LO quadrature error significantly, enough to meet the requirements imposed on new emerging receiver topologies without requiring any calibration at start-up of the chip. In that regard, while certain preferred embodiments of the present invention have been disclosed and described herein for purposes of illustration and not for purposes of limitation, it will be understood by those skilled in the art that various changes in form and detail may be made therein without departing from the spirit and scope of the invention. The changes that one skilled in the art may make, among other changes, include the use of different types of transistors, such a MOS transistors, to name but one other type.

What is claimed is:

1. A mixer circuit for receiving a local oscillator signal and providing mixer outputs having reduced second order intermodulation comprising:

four bipolar mixer transistors, all of the same conductivity type, each having an emitter, a base and a collector, the emitters and collectors being coupled to mixer inputs and mixer outputs, respectively, thereby forming a doubly balanced mixer;

a local oscillator amplifier having an input coupled to receive the local oscillator signal and to provide a local oscillator amplifier differential output;

one of the local oscillator outputs being coupled to the bases of two of the four bipolar mixer transistors and the other of the local oscillator outputs being coupled to the bases of the other two of the four bipolar mixer transistors, the bases of the four bipolar mixer transistors also being resistively coupled to a common mode voltage, the resistance of each resistive coupling being less than the total base input impedances of the bipolar mixer transistors coupled thereto to reduce the effect of beta mismatches in the bipolar transistors, the local oscillator amplifier having a local oscillator output impedance that is less than the combined resistance of the resistive coupling.

2. The mixer circuit of claim 1 wherein the local oscillator amplifier has an output slew rate in volts per second that is at least 4 volts times a frequency of operation of the local oscillator amplifier in cycles per second.

3. The mixer circuit of claim 1 wherein the local oscillator amplifier has a local oscillator output impedance that is less than one half of the combined resistance of the resistive coupling.

4. The mixer circuit of claim 1 wherein the local oscillator amplifier has a local oscillator output impedance that is less than one fourth of the combined resistance of the resistive coupling.

5. The mixer circuit of claim 1 wherein the resistance of each resistive coupling is less than one half the total base input impedances of the mixer transistors coupled thereto.

6. The mixer circuit of claim 1 wherein the resistance of each resistive coupling is less than one fourth the total base input impedances of the mixer transistors coupled thereto.

7. The mixer circuit of claim 1 wherein the bases of the four mixer transistors are resistively coupled to a common mode voltage, each through a separate respective one of four resistors.

8. The mixer circuit of claim 7 wherein one of the local oscillator outputs is coupled to the bases of two of the four mixer transistors, each through a respective one of two capacitances, and the other of the local oscillator outputs is coupled to the bases of the other two of the four mixer transistors, each through a respective one of two more capacitances.

9. The mixer circuit of claim 1 wherein the local oscillator differential output is a push-pull output.

10. A mixer comprising multiple mixer circuits of claim 1, and logic circuitry coupled to the multiple mixer circuits and enabling individual selection of each of the multiple mixer circuits for evaluation, and the permanent selection of one of the multiple mixer circuits at the time of wafer sort, for subsequent use.

11. The mixer circuit of claim 1 for reducing second order intermodulation wherein the mixer circuit directly converts an RF signal to baseband frequencies.

12. A mixer circuit for receiving a local oscillator signal and providing mixer outputs having reduced second order intermodulation comprising:

a local oscillator amplifier having bipolar transistors, each having an emitter, a base and a collector, the local oscillator amplifier having a first stage formed by a differential transistor pair coupled to receive the local oscillator signal, a common collector second stage coupled to an output of the first stage, and a push-pull third stage coupled to an output of the second stage to provide a local oscillator amplifier differential output;

four bipolar mixer transistors, all of the same conductivity type, each having an emitter, a base and a collector, the emitters and collectors of the four bipolar mixer transistors being coupled to mixer inputs and mixer outputs, respectively, thereby forming a doubly balanced mixer;

four resistors, each having first and second terminals, the first terminals being connected together and to a common mode voltage, the second terminals each being connected to the base of a respective bipolar mixer transistor;

the second terminal of two of the four resistors being capacitively coupled to one of the local oscillator amplifier differential outputs and the second terminal of the other two of the four mixer transistors being capacitively coupled to a second of the local oscillator amplifier differential outputs;

the resistance of each resistor being less than the total base input impedances of the bipolar mixer transistors coupled thereto to reduce the effect of beta mismatches in the bipolar transistors, the local oscillator amplifier having a local oscillator output impedance that is less than the combined resistance of the resistive coupling.

13. The mixer circuit of claim 12 wherein the local oscillator amplifier has an output slew rate in volts per second that is at least 4 volts times a frequency of operation of the local oscillator amplifier in cycles per second.

14. The mixer circuit of claim 12 wherein the second terminal of each of the four resistors are independently capacitively coupled to the local oscillator amplifier differential outputs.

15. The mixer circuit of claim 12 wherein the four resistors each have a resistance that is less than the base input impedance of each of the four mixer transistors.

16. The mixer circuit of claim 12 wherein the four resistors each have a resistance that is less than one half the base input impedance of each of the four mixer transistors.

17. The mixer circuit of claim 12 wherein the four resistors each have a resistance that is less than one fourth the base input impedance of each of the four mixer transistors.

18. The mixer circuit of claim 12 wherein the local oscillator amplifier has an output impedance that is less than the combined resistance of the four resistors.

19. The mixer circuit of claim 12 wherein the local oscillator amplifier has an output impedance that is less than one half the combined resistance of the four resistors.

20. The mixer circuit of claim 12 wherein the local oscillator amplifier has an output impedance that is less than one fourth the combined resistance of the four resistors.

21. The mixer circuit of claim 12 wherein the four resistors each have a resistance that is less than one half the base input impedance of each of the four mixer transistors, and the local oscillator amplifier has an output impedance that is less than one half the combined resistance of the four resistors.

22. The mixer circuit of claim 12 wherein the four resistors each have a resistance that is less than one fourth the control terminal input impedance of each of the four mixer transistors, and the local oscillator amplifier has an output impedance that is less than one fourth the combined resistance of the four resistors.

23. A mixer comprising multiple mixer circuits of claim 12, and logic circuitry coupled to the multiple mixer circuits and enabling individual selection of each of the multiple mixer circuits for evaluation, and the permanent selection of one of the multiple mixer circuits a the time of wafer sort, for subsequent use.

24. The mixer circuit of claim 12 wherein the mixer circuit directly converts an RF signal to baseband frequencies.

25. A method of reducing the second order intermodulation in the output of a mixer comprising:

providing four bipolar mixer transistors, all of the same conductivity type, each having an emitter, a base and a collector, the emitters and collectors being coupled to mixer inputs and mixer outputs, respectively;

coupling the bases of the four mixer transistors to a reference voltage through resistors, each resistor having a resistance that is less than base impedances of the mixer transistors coupled thereto to reduce the effect of beta mismatches in the bipolar transistors, and to a local oscillator signal having an impedance that is less than the combined impedance of the resistors.

26. The method of claim 25 wherein the local oscillator signal has an output slew rate in volts per second that is at least 4 volts times a frequency of operation of the local oscillator amplifier in cycles per second.

27. The method of claim 25 wherein the control terminals of the four bipolar mixer transistors are capacitively coupled to the local oscillator signal.

28. The method of claim 27 wherein each base is coupled to the reference voltage through a separate resistor.

29. The method of claim 28 wherein each base is coupled to the local oscillator signal through a separate capacitor.

30. The method of claim 25 wherein each resistor has a resistance that is less than one half the total base impedances of the mixer transistors coupled thereto.

31. The method of claim 25 wherein each resistor has a resistance that is less than one fourth the total base impedances of the mixer transistors coupled thereto.

32. The method of claim 25 wherein the local oscillator has an output impedance that is less than one half the combined impedance of the resistors.

33. The method of claim 25 wherein the local oscillator has an output impedance that is less than one fourth the combined impedance of the resistors.

34. A method of reducing the second order intermodulation in the output of a mixer comprising providing multiple circuitry, each circuitry being adapted for practicing the method of claim 25, measuring the second order intermodulation of each circuitry, and permanently selecting for use at the time of wafer sort, the circuitry with the lowest measured second order intermodulation.

35. The method of claim 25 further comprising providing the local oscillator signal by amplifying a local oscillator input with an amplifier having a push-pull complementary output stage.

36. The method of claim 35 wherein the amplifier has a differential input stage.

* * * * *